United States Patent
Seo

(10) Patent No.: US 7,620,878 B2
(45) Date of Patent: Nov. 17, 2009

(54) APPARATUSES AND METHODS FOR CHECKING INTEGRITY OF TRANSMISSION DATA

(75) Inventor: Jae-Won Seo, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 680 days.

(21) Appl. No.: 11/371,087

(22) Filed: Mar. 9, 2006

(65) Prior Publication Data

US 2006/0236199 A1    Oct. 19, 2006

(30) Foreign Application Priority Data

Mar. 9, 2005    (KR)    ............... 10-2005-0019669

(51) Int. Cl.
*H03M 13/00*    (2006.01)
(52) U.S. Cl. .................................................... 714/781
(58) Field of Classification Search ................ 714/758, 714/781

See application file for complete search history.

(56) References Cited

U.S. PATENT DOCUMENTS

| 6,192,498 | B1 | 2/2001 | Arato |
| 6,671,832 | B1 | 12/2003 | Apisdorf ...................... 714/52 |
| 6,766,493 | B1 * | 7/2004 | Hoffman et al. ............. 714/785 |
| 7,082,563 | B2 * | 7/2006 | Gemelli et al. .............. 714/758 |

FOREIGN PATENT DOCUMENTS

| JP | 06-012269 | 1/1994 |
| KR | 1999-022495 | 3/1999 |

OTHER PUBLICATIONS

German Patent Office Action dated Sep. 16, 2008 for corresponding German Patent Application No. 10 2006 011 902.9-31.

* cited by examiner

*Primary Examiner*—Shelly A Chase

(57) ABSTRACT

A generator may include a monitoring unit, an engine unit and/or a register. The monitoring unit may selectively extract at least a portion of data to be transmitted to, or received from, an external communication device. The engine unit may generate an error check code using a polynomial expression or a checksum according to a transmission format associated with the extracted data. The register may store the generated error check code.

18 Claims, 3 Drawing Sheets

APPARATUSES AND METHODS FOR CHECKING INTEGRITY OF TRANSMISSION DATA

PRIORITY STATEMENT

This application claims priority under 35 U.S.C. §119 to Korean Patent Application No. 2005-19669, filed on Mar. 9, 2005 in the Korean Intellectual Property Office (KIPO), the entire contents of which are incorporated herein by reference.

BACKGROUND

1. Field of the Invention

Example embodiments of the present invention relate to apparatuses and methods for checking integrity of transmission data, for example, an apparatus and method for generating a universal CRC/checksum.

2. Description of the Related Art

Methods of detecting and/or correcting transmission errors generated during data transmission has been continuously developed to improve accuracy, efficiency, and/or to increase speed. Conventionally, a cyclic redundancy check (CRC) scheme and/or a checksum scheme have been used to detect and correct transmission errors.

According to a conventional checksum scheme, a receiver may count the number of bits in a unit of transmitted data in order to determine whether same number of bits having a value of 1 have been received at a receiver. If the same number of bits having a value of 1 have been received, the receiver determines that no transmission errors have occurred.

The CRC scheme is used, for example, in a digital data communication. A transmitter may consider transmission data as a polynomial expression and may generate a cyclic redundancy code (CRC) by using a polynomial expression. For example, a bit value or reminder is calculated using the polynomial expression and data to be transmitted. The calculated reminder may be appended to the data as a CRC, and the transmitter transmits the data with the CRC to a receiver. The receiver receives the transmitted data and determines whether transmission errors have occurred using the same polynomial expression used to generate the CRC at the transmitter. For example, the receiver calculates a reminder using the same polynomial expression and the received data. If the calculated reminder is 0, the receiver determines that no errors have occurred. If the reminder is not 0, the receiver determines that errors have may be included in the received data.

A CRC/checksum calculating unit may be implemented as hardware to calculate the CRC or the checksum. The CRC calculating unit may include a shift register and an exclusive logic sum gate. Since an arrangement of the shift register and the exclusive logic sum gate in the CRC calculating unit is determined according to the polynomial expression, the CRC calculating unit may not be modified after the CRC calculating unit is manufactured. Therefore, CRC calculating unit may be designed and/or manufactured differently according to polynomial expressions used in the transmitter and/or the receiver. Additionally, the transmitter and the receiver must have a CRC calculating unit employing a same polynomial expression.

In order to apply various polynomial expressions dynamically a software CRC calculating unit may be used. Such a software CRC calculating unit may be implemented into various transmitters and/or receivers employing different polynomial expressions by interchanging programs and/or data of the software CRC calculating unit. However, this may result in increase work load allocated to a processor of a communication terminal because the conventional software CRC calculating unit uses the processor of the communication terminal to perform necessary operations for calculating the CRC, and thus, may degrade performance of the communication terminal. Additionally, the software CRC calculator may have slower calculation speed and/or may not be suitable for high-speed communication.

SUMMARY OF THE INVENTION

One or more example embodiments of the present invention are directed to an apparatus and method for checking transmission data integrity. One or more example embodiments of the present invention provide an error check code generator for generating an error check code (e.g., a CRC and/or a checksum) independently of transmission format or data communication protocol used to transmit data.

One or more example embodiments of the present invention provide a communication device having an error check code generator for error checking of transmitted or received data and a method thereof.

A generator according to an example embodiment of the present invention may include a monitoring unit, an engine unit and/or a register. The monitoring unit may selectively extract at least a portion of data to be transmitted to, or received from, an external device. The engine unit may generate an error check code using a polynomial expression or checksum associated with a transmission format of the extracted data. The register may store the generated error check code.

In a method of error checking data, according to an example embodiment of the present invention, an address range of transmitted or received data and a transmission format of the transmitted or received data may be stored. The transmitted or received data may be data to be transmitted to, or received from, an external device. A result of a previous integrity check may be initialized and data may be selectively extracted from the transmitted or received data. An error check code may be generated using a polynomial expression or a checksum according to the stored transmission format of the extracted data, and the generated error check code may be stored. The extracted data may be error checked using the stored error check code.

A communication device according to an example embodiment of the present invention may include a bus, a generator and/or a processor. The bus may transfer data to be transmitted to, or received from, an external communication device. The generator may selectively extract at least a portion of the data transferred on the bus, generate an error check code using a polynomial expression or a checksum associated with a transmission format of the extracted data, and store the generated error check code. The processor may store an address range of data to be error checked and the transmission format of the data stored in the register, and error check the data using a result value calculated in the generator.

In example embodiments of the present invention, the error check code may be a cyclic redundancy code or a checksum. The register may store an address range of the extracted data, and the monitoring unit may selectively extract data by referring to the address range of the data stored in the register. The register may store the transmission format of the extracted data, and the engine unit may perform an error check operation suitable for the stored transmission format in the register by referring to the register.

In example embodiments of the present invention, the engine unit may store polynomial expressions or checksum calculation methods associated with transmission formats used to transmit data, the monitoring unit may extract data by referring to the address range of the data stored in the register and/or the engine unit may calculate the error check code according to the transmission format stored in the register. The processor may initialize a result value stored in the register when data is transmitted or received from an external device.

BRIEF DESCRIPTION OF THE DRAWINGS

The accompanying drawings, which are included to provide a further understanding of the invention and are incorporated in and constitute a part of this application, illustrate example embodiment(s) of the present invention and together with the description serve to explain the principle of the present invention. They are not, however, intended to be limiting in anyway. In the drawings.

DETAILED DESCRIPTION OF EXAMPLE EMBODIMENTS OF THE PRESENT INVENTION

Reference will now be made in detail to example embodiments of the present invention as illustrated in the accompanying drawings. However, the present invention is not limited to example embodiments illustrated herein after, and the example embodiments herein are rather introduced to provide easy and complete understanding of the scope and spirit of the present invention.

Figure 1:
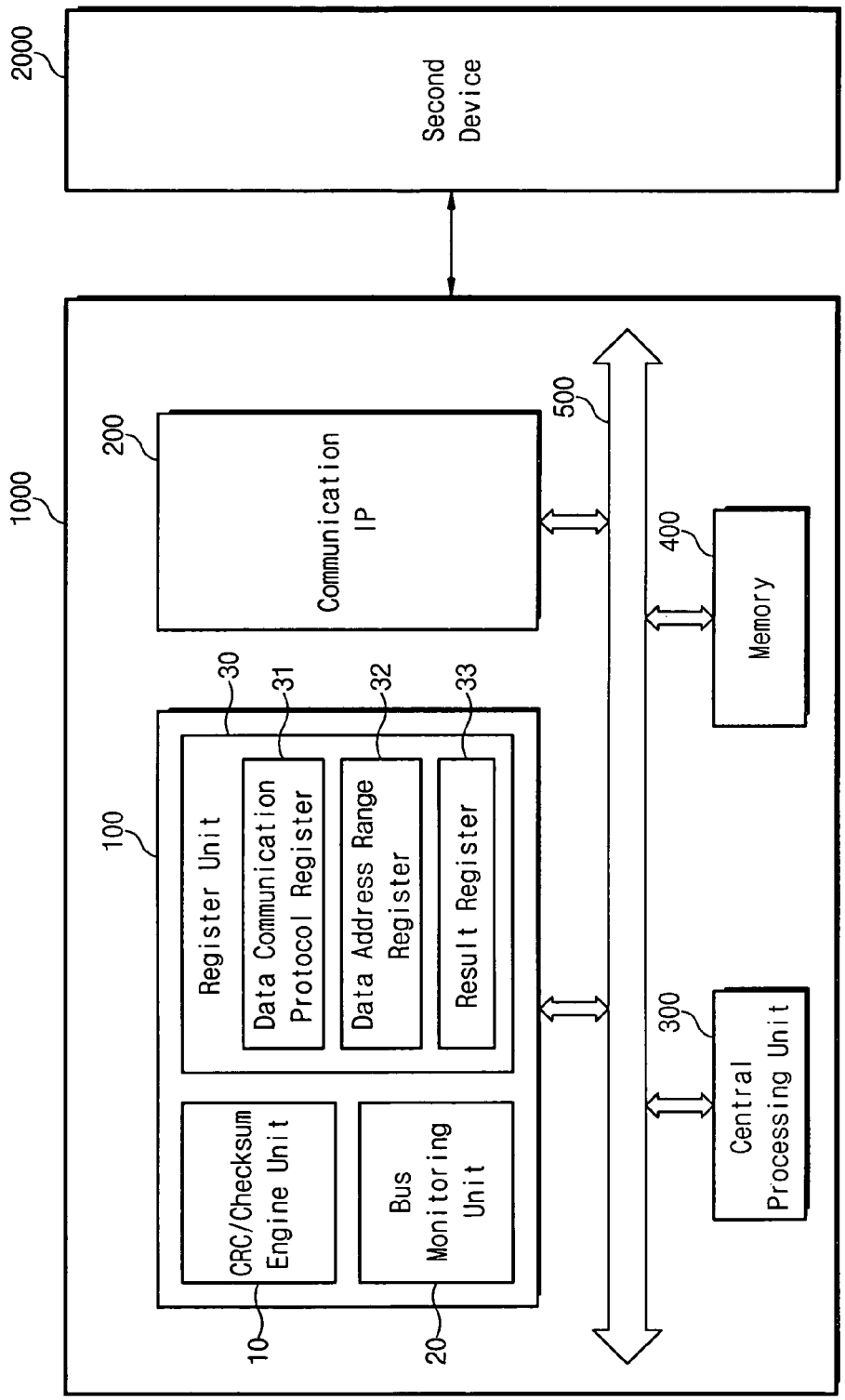
FIG. 1 is a block diagram illustrating a communication system according to an example embodiment of the present invention.

FIG. 1 is a block diagram illustrating a communication system according to an example embodiment of the present invention. As shown, the communication system of FIG. 1 may include communication devices (e.g., semiconductor communication devices) 1000 and 2000. At least one of the communication devices 1000 and 2000 may include a generator (e.g., an error check code generator, such as, a universal CRC/checksum generator) 100, a communication Internet protocol (IP) 200, a central processing unit 300, a memory 400 and/or a bus 500. For the sake of brevity, however, example embodiments of the present invention will be discussed with regard to communication device 1000.

The generator 100 may include an engine unit (e.g., error check code engine unit, such as, a CRC/checksum engine unit) 10, a bus monitoring unit 20 and/or a register unit 30. In example operation, the generator 100 may detect and/or correct transmission errors.

In one example operation, the engine unit 10 may calculate an error check code, for example, CRC data and/or a checksum. In order to calculate the CRC data, for example, CRC polynomial expressions associated with each transmission format or data communication protocol used to transmit and/or receive data may be stored in the engine unit 10. The engine unit 10 may select and use one of the stored polynomial expressions based on a transmission format or data communication protocol currently being used to transmit and/or receive data.

The bus monitoring unit 20 may read target data from among data carried on a data bus when a data of a known (e.g., predetermined) address is transacted. The register unit 30 may include a data communication protocol register 31, a data address range register 32 and/or a result register 33. The data communication protocol register 31 may store a value representing a transmission format or data communication protocol currently being used to transmit and/or receive data. For example, the transmission format or data communication protocol may be IEEE 802.11 MAC frame format, IEEE 802.16 MAC frame format, IEEE 802.3 MAC frame format, ATM AAL3/2, ATM AAL5 or any other suitable transmission format or data communication protocol.

According to the value of the data communication protocol register 31, the engine unit 10 may perform an error check code (e.g., a CRC and/or checksum) for detecting and/or correcting transmission errors. The data address range register 32 may store a range of addresses of, for example, one or more polynomial expressions or data to be using in calculating the error check code, such as, the CRC and/or checksum. For example, the data address range register 32 may store a start address and/or an end address of transmission format or communication protocol data to be used in calculating the error check code (e.g., a checksum and/or CRC). The bus monitoring unit 20 may read data by referring to the addresses stored in the data address range register 32 when data of start address and/or end address set in the data address range register 32 are transacted. The result register 33 may store the error check code (e.g., the CRC and/or checksum) calculated by the engine unit 10.

The communication IP 200 may be operated as an input unit and/or output unit when the communication device 1000 communicates with the device (e.g., communication device) 2000. The communication IP 200, according to one or more example embodiments of the present invention, may be operated (e.g., exclusively) as an input unit and/or output unit. As discussed herein, the device 2000 may be a communication device communicating with (e.g., transmitting data to, or receiving data from) the communication device 1000 and detecting and/or correcting data transmission errors using an error check code (e.g., a CRC and/or checksum).

The central processing unit 300 may control the communication device 1000. For example, when data communication begins, the central processing unit 300 may recognize a transmission format or data communication protocol currently being used to transmit and/or receive data. The central processing unit 300 may set the data communication protocol register 31 of the generator 100 based on the recognized transmission format or data communication protocol. In addition, the central processing unit 300 may store the data address range of the data (e.g., a polynomial expression associated with the transmission format or data communication protocol) to be used in calculating the error check code (e.g., the CRC and/or checksum) in the data address range register 32 of the generator 100. The central processing unit 300 may initialize the values of the result register 33 of the generator 100.

The central processing unit 300 may transmit (e.g., externally transmit) data with the stored result value in the result register 33 and/or check the integrity of (e.g., error check) received data by comparing a received error check code (e.g., a CRC and/or checksum) with the result value stored in the result register 33.

The memory 400 may store data input and/or output through the communication IP 200. The bus 500 may be used as a data transmission path. When data is stored in the memory 400 via the bus 500, the bus monitoring unit 20 of the generator 100 may read data traversing the bus 500.

Figure 2:
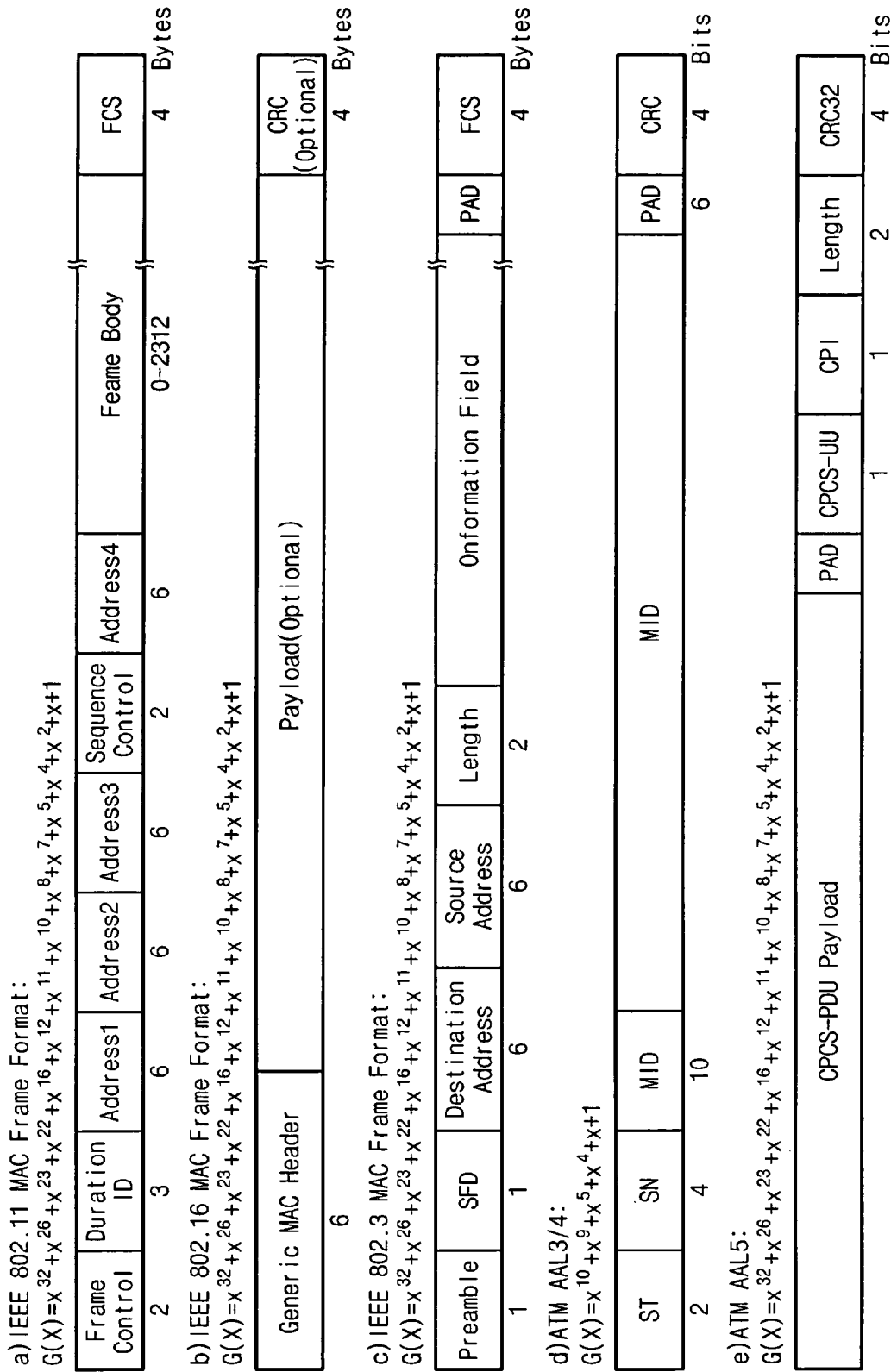
FIG. 2 is a diagram depicting a structure of various data communication protocols.

FIG. 2 is a diagram showing a data structure of various data communication protocols. As shown, polynomial expressions G(X) denote example polynomial expressions, which may be used in accordance with the shown transmission formats or data communication protocols. The polynomial expressions G(X) may be stored in the engine unit 10 of the generator 100. The central processing unit 300 may recognize a transmission format or data communication protocol currently being used to transmit data, and the central processing unit 300 may set the data communication protocol register 31 of the generator 100 according to the recognized transmission format or data communication protocol. Accordingly, data transmission errors for various transmission formats or data communication protocols may be detected and/or corrected using the generator 100, for example, independently of transmission format or data communication protocols used to transmit data. In other words, the generator 100 according to example embodiments of the present invention may be operated independent of the transmission formats or data communication protocols used to transmit data.

Figure 3:
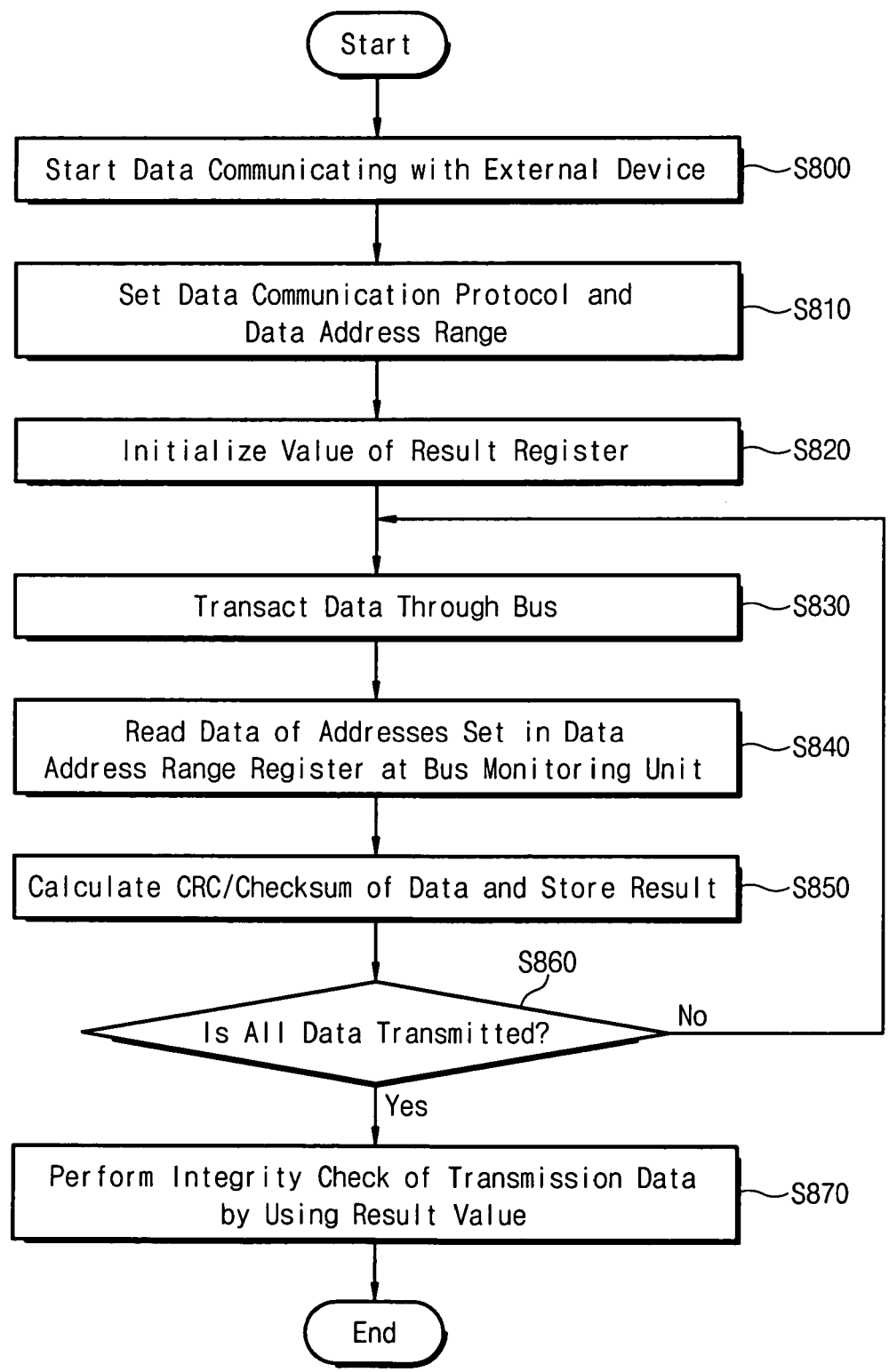
FIG. 3 is a flowchart illustrating a method for detecting transmission errors according to an example embodiment of the present invention.

FIG. 3 is a flowchart illustrating a method of detecting transmission errors according to an example embodiment of the present invention. As shown, when data communication (e.g., transmission or reception of data) through a wireless channel and/or a wired channel begins at S800, the central processing unit 300 may set a transmission format or data communication protocol and a data address range at the data communication register 31 and the data address range register 32, respectively, at S810. The central processing unit 300 may initialize a value of the result register 33 at S820.

When data is transferred on the bus 500 in the communication device 1000 at S830, the bus monitoring unit 20 of the generator 100 may read data of the data address range set in the data address range register 32 at S840. For example, the at least a portion of the data transferred on the bus may be extracted. The engine unit 10 may generate (e.g., via a calculation) an error check code (e.g., a CRC and/or a checksum) using, for example, a polynomial expression (e.g., a CRC polynomial expression) and/or a checksum based on a value set in the data communication protocol register 31. The engine unit 10 may store the result of the calculation in the result register 33 at S850.

The engine unit 10 may determine whether the data transmission has completed at S860. If the data transmission has completed, the central processing unit 300 may transmit the result value stored in the result register 33 with the transmitted data to an external device, and/or may check the integrity of (e.g., error check) the received data by comparing a received error check code (e.g., a CRC and/or checksum) with the result value stored in the result register 33 at S870.

As described above, data transmission errors of various transmission formats or data communication protocols may be detected and/or corrected by using a generator according to example embodiments of the present invention. In one or more example embodiments of the present invention, a universal error check code generator, such as, a CRC/checksum generator may detect transmission errors more quickly and/or perform necessary operations more quickly. Additionally, generators according to one or more example embodiments of the present invention may be more flexible in that they may be used independently from data communication protocols used to transmit and/or receive data.

As discussed herein, a communication device, according to one or more example embodiments of the present invention, may be any suitable wireless or terrestrial communication device, for example, a mobile or cellular phone, PDA, combination mobile phone/PDA, etc. In addition, the generator and/or methods, according to one or more example embodiments of the present invention, may be implemented in any conventional terrestrial and/or wireless communication devices as desired.

Although example embodiments of the present invention have been described with regard to error detection and/or correction using CRC and/or checksum, it will be understood that any suitable error detection and/or correction methods using any error check code may be used.

Example embodiments of the present invention have been described. However, it is understood example embodiments of the present invention are not limited to the disclosed example embodiments. On the contrary, the present specification is intended to cover various modifications and similar arrangements. The scope of the claims, therefore, should be accorded the broadest interpretation so as to encompass all such modifications and similar arrangements.

What is claimed is:

1. A generator comprising:
   a monitoring unit for selectively extracting at least a portion of data to be transmitted to, or received from, an external device;
   an engine unit for generating an error check code using a polynomial expression or checksum associated with a transmission format of the extracted data; and
   a register for storing the generated error check code; and
   a central processing unit for initializing a result of a previous integrity check in the register, where the central processing unit checks the portion of data using the stored error check code.

2. The generator of claim 1, wherein the error check code is a cyclic redundancy code or a checksum.

3. The generator of claim 1, wherein the register stores an address range of the extracted data in response to the central processing unit, and the monitoring unit selectively extracts data by referring to the address range of the data stored in the register.

4. The generator of claim 1, wherein the register stores the transmission format of the extracted data, and the engine unit performs an error check operation suitable for the stored transmission format in the register by referring to the register.

5. The generator of claim 1, wherein the engine unit stores polynomial expressions or checksum calculation methods associated with transmission formats used to transmit data.

6. A communication device comprising:
   a bus for transferring data to be transmitted to, or received from, an external communication device;
   a generator for selectively extracting at least a portion of the data, generating an error check code using a polynomial expression or a checksum associated with a transmission format of the extracted data and storing the generated error check code; and
   a processor for storing an address range of data to be error checked and the transmission format of the data stored in the register, and error checking the data using a result value calculated in the generator, the generator comprising:
      a monitoring unit for selectively extracting at least a portion of the data to be transmitted to, or received from, an external device;
      an engine unit for generating an error check code using a polynomial expression or checksum associated with a transmission format of the extracted data;
      a register for storing the generated error check code;
      and a central processing unit for initializing a result of a previous integrity check in the register, wherein
         the central processing unit checks the portion of data using the stored error check code.

7. The communication device of claim 6, wherein the error check code is a cyclic redundancy code or a checksum.

8. The communication device of claim 6, wherein the generator further includes,
a monitoring unit for selectively extracting at least a portion of the data,
an engine unit for generating the error check code, and
a register for storing the generated error check code.

9. The communication device of claim 8, wherein the monitoring unit extracts the data by referring to the address range of the data stored in the register.

10. The communication device of claim 8, wherein the engine unit calculates the error check code according to the transmission format stored in the register.

11. The communication device of claim 8, wherein the engine unit stores polynomial expressions or checksum calculation methods associated with transmission formats used to transmit data.

12. The communication device of claim 8, wherein the processor initializes a result value stored in the register when data is transmitted or received from an external device.

13. A method of error checking data, comprising:
storing an address range of transmitted or received data and a transmission format of the transmitted or received data, the transmitted or received data being data to be transmitted to, or received from, an external device;
initializing a result of a previous integrity check;
selectively extracting data from the transmitted or received data;
generating an error check code using a polynomial expression or a checksum according to the stored transmission format of the extracted data, and storing the generated error check code; and
error checking the data using the stored error check code.

14. The method of claim 13, wherein the error check code is a cyclic redundancy code or a checksum.

15. The method of claim 13, wherein the communication device stores polynomial expressions or checksum calculation methods associated with various transmission formats used to transmit data.

16. A communication device including the generator of claim 1.

17. A generator for performing the method of claim 13.

18. A communication device including the generator of claim 17.

* * * * *